(12) United States Patent
Verhoeven (10) Patent No.: US 7,423,310 B2
(45) Date of Patent: Sep. 9, 2008

(54) CHARGE-TRAPPING MEMORY CELL AND CHARGE-TRAPPING MEMORY DEVICE

(75) Inventor: Martin Verhoeven, Radebeul (DE)

(73) Assignee: Infineon Technologies AG, Munich (DE)

( * ) Notice: Subject to any disclaimer, the term of this patent is extended or adjusted under 35 U.S.C. 154(b) by 136 days.

(21) Appl. No.: 10/952,707

(22) Filed: Sep. 29, 2004

(65) Prior Publication Data

US 2006/0071259 A1    Apr. 6, 2006

(51) Int. Cl.
*H01L 27/108*    (2006.01)
(52) U.S. Cl. ........................ 257/308; 257/329
(58) Field of Classification Search ............... 257/329, 257/308, 299
See application file for complete search history.

(56) References Cited

U.S. PATENT DOCUMENTS

| | | | |
|---|---|---|---|
| 6,555,870 B1 | 4/2003 | Kirisawa | |
| 6,756,271 B1 | 6/2004 | Satoh et al. | |
| 2002/0055247 A1 | 5/2002 | Reisinger | |
| 2003/0015755 A1* | 1/2003 | Hagemeyer | 257/329 |
| 2003/0042531 A1 | 3/2003 | Lee et al. | |
| 2005/0124120 A1* | 6/2005 | Du et al. | 438/283 |
| 2005/0186738 A1 | 8/2005 | Hofmann et al. | |
| 2005/0199913 A1 | 9/2005 | Hofmann et al. | |
| 2005/0286296 A1 | 12/2005 | Bollu et al. | |
| 2006/0001058 A1 | 1/2006 | Dreeskomfeld et al. | |

FOREIGN PATENT DOCUMENTS

| | | |
|---|---|---|
| DE | 102 19 917 A1 | 11/2003 |
| DE | 102 41 170 A1 | 3/2004 |
| DE | 102 41 171 A1 | 3/2004 |
| WO | WO 03/096424 A1 | 11/2003 |
| WO | WO 2004/053982 A2 | 6/2004 |
| WO | WO 2004/059738 A1 | 7/2004 |

OTHER PUBLICATIONS

Eitan, B., et al., "NROM: A Novel Localized Trapping, 2-Bit Non-volatile Memory Cell," IEEE Electron Device Letters, vol. 21, No. 11, Nov. 2000, pp. 543-545.

* cited by examiner

*Primary Examiner*—Keisha L Rose
(74) *Attorney, Agent, or Firm*—Slater & Matsil, L.L.P.

(57) ABSTRACT

The memory cell is arranged in a ridge of semiconductor material forming a fin with sidewalls and a channel region between source and drain regions. Memory layer sequences provided for charge-trapping are applied to the sidewalls, and gate electrodes are arranged on both sides of the ridge. A plurality of ridges at a distance parallel to one another and have sidewalls facing a neighboring ridge form an array of charge-trapping memory cells. Wordlines are arranged between the ridges, sections of the wordlines forming the gate electrodes. This arrangement enables a double gate operation of the cells and thus allows for a storage of four bits of information in every single memory cell structure.

29 Claims, 8 Drawing Sheets

CHARGE-TRAPPING MEMORY CELL AND CHARGE-TRAPPING MEMORY DEVICE

TECHNICAL FIELD

The present invention concerns charge-trapping memory cells, especially memory cells of the SONOS or NROM type, and memory devices comprising arrays of such memory cells.

BACKGROUND

Non-volatile memory cells that are electrically programmable and erasable can be realized as charge-trapping memory cells which comprise a memory layer sequence of dielectric materials with a memory layer between confinement layers of dielectric material having a larger energy bend gap than the memory layer. This memory layer sequence is arranged between a channel region within a semiconductor layer or substrate and a gate electrode, which is provided to control the channel by means of an applied electric voltage. The programming of the cell is performed by the acceleration of charge carriers, especially electrons, in the channel region to generate charge carriers of sufficient kinetic energy (channel hot electrons) to penetrate the confinement layer and to be trapped in the memory layer. Source and drain regions are provided at both ends of the channel region to apply the accelerating electric voltage.

The threshold voltage of the transistor structure is sensed when the programmed state of the memory cell is read. It is possible to store bits at both channel ends by the application of reverse operating voltages. This means that two bits can be programmed in each charge-trapping memory cell. Examples of charge-trapping memory cells are the SONOS memory cells, in which each confinement layer is an oxide of the semiconductor material and the memory layer is a nitride of the semiconductor material, usually silicon.

A publication by B. Eitan et al., "NROM: a Novel Localized Trapping, 2-Bit Nonvolatile Memory Cell" in IEEE Electron Device Letters, volume 21, pages 543 to 545 (2000), which is incorporated herein by reference, describes a charge-trapping memory cell with a memory layer sequence of oxide, nitride and oxide which is especially adapted to be operated with a reading voltage that is reverse to the programming voltage (reverse read). The oxide-nitride-oxide layer sequence is especially designed to avoid the direct tunneling regime and to guarantee the vertical retention of the trapped charge carriers. The oxide layers are specified to have a thickness of more than 5 nm.

A type of field effect transistor is formed in a so-called finfet structure, in which the channel region and the source and drain regions are arranged in a ridge or fin at a surface of a semiconductor substrate. The gate electrode is applied to the fin either on the top, at a sidewall or in bridge-like fashion across the fin; and the direction of the channel is parallel to the longitudinal extension of the fin.

SUMMARY OF THE INVENTION

In one aspect, the present invention increases the storage capacity of charge-trapping memory devices.

In a further aspect, the present invention discloses a memory device with high storage density that is easily produced with standard semiconductor technology.

In still a further aspect, the present invention discloses production methods that are especially adapted to the device structure according to this invention.

The charge-trapping memory cell according to embodiments of this invention comprises a ridge of semiconductor material forming a fin with sidewalls. Memory layer sequences provided for charge-trapping are applied to the sidewalls, and gate electrodes are arranged on both sides of the ridge above the memory layer sequences. The gate electrodes are arranged so as to control a channel region located within the ridge between doped regions, which are provided as source and drain and which are arranged at a distance from one another within the ridge. A plurality of ridges which are arranged at a distance parallel to one another and have sidewalls facing a neighboring ridge, form an array of charge-trapping memory cells that are arranged along rows and columns. Wordlines are arranged between the ridges, sections of the wordlines that are adjacent to the channel region forming the gate electrodes. This arrangement enables a double gate operation of the cells and thus allows for a storage of four bits of information in every single memory cell structure.

The preferred production method makes use of a dopant glass or other doped material suitable for the diffusion of doping atoms, which is filled in trenches that are etched across the direction of the ridges. The source and drain regions are formed by an outdiffusion of dopant from this material. After the formation of the ridges, a layer sequence of dielectric materials suitable for charge-trapping memory layer sequences is applied all over the surface, including the sidewalls of the ridges. Between the ridges, an electrically conductive material like doped polysilicon or tungsten is filled to form the wordlines comprising the gate electrodes of the individual memory cells.

The source and drain regions are preferably contacted on the top by means of local interconnects that are arranged above in such a manner that each local interconnect contacts two subsequent source/drain regions of the same ridge. In order to obtain alternating connections of the interconnects to the bitlines, it is preferable to have additional connections between the bitlines and the local interconnects so that the bitlines can be arranged slightly deviating from the symmetry axis between subsequent source and drain regions. This enables a separate addressing of both parts of each memory cell by means of the two separate gate electrodes. In this manner, four bits can be stored in every memory cell.

These and other features and advantages of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawing, in which.

The following list of reference symbols can be used in conjunction with the figures:
1 fin
2 source/drain region
3 gate electrode
4 memory layer sequence
5 local interconnect
6 contact to interconnect
7 conductor track
8 bit position
9 passing bitline
10 substrate
11 first trench
12 dopant glass
13 diffusion region
14 second trench
15 ridge
16 dielectric layer sequence
17 electrically conducting material
18 insulating cover
19 insulating filling
20 dielectric layer
21 further dielectric layer
BL bitline
WL wordline

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
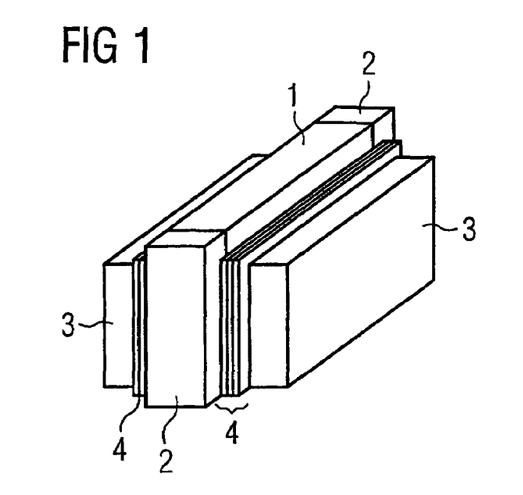
FIG. 1 is a perspective view showing the principal structure of the memory cell.

FIG. 1 shows a perspective view of the principal structure of a memory cell according to the preferred embodiment of the invention, isolated from the memory device. This memory cell comprises a fin 1, which can be part of a ridge of semiconductor material. At the longitudinal ends of the fin 1, source/drain regions 2 are formed as doped regions. The fin preferably comprises a basic doping, for example of p-conductivity. The source/drain regions 2 are doped for the opposite conductivity type and with a higher concentration of doping atoms.

On both sidewalls of the fin 1, there are gate electrodes 3, which are electrically insulated from the semiconductor material by memory layer sequences 4. The memory layer sequences 4 comprise a memory layer provided for the trapping of charge carriers and arranged between confinement layers of higher energy band gap. The memory layer sequence 4 can be formed of any sequence of dielectric materials which is suitable as charge-trapping memory layer sequence. The memory layer sequence 4 may especially be an oxide-nitride-oxide layer sequence.

The memory layer can be substituted with another dielectric material, provided the energy band gap is smaller than the energy band gap of the confinement layers. When using silicon dioxide as confinement layers, the memory layer may be tantalum oxide, cadmium silicate, titanium oxide, zirconium oxide or aluminum oxide. Also intrinsically conducting (non-doped) silicon may be used as the material of the memory layer.

Figure 2:
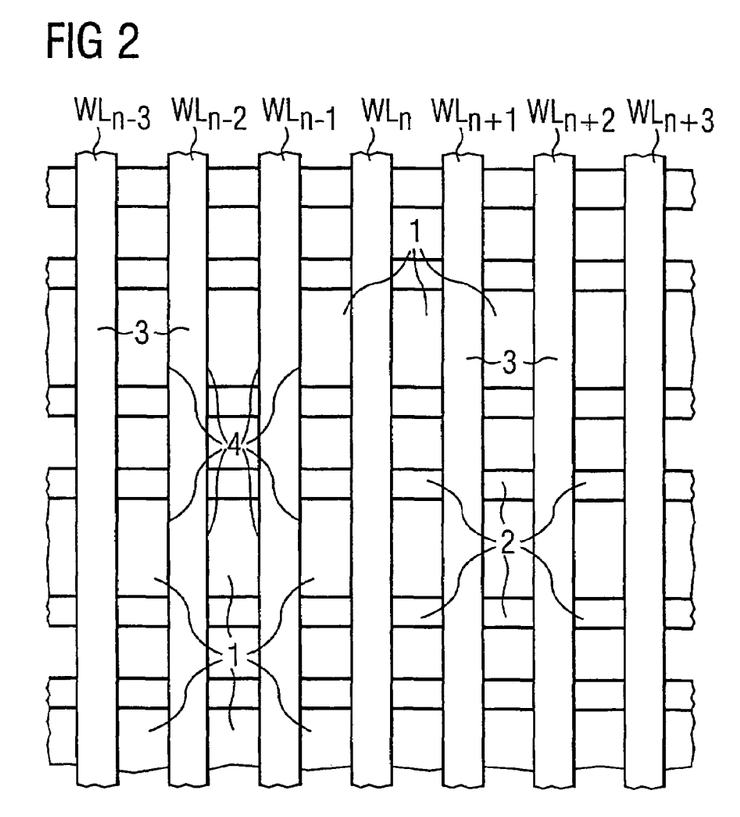
FIG. 2 is a top view of a memory device showing the arrangement of wordlines and ridges.

FIG. 2 shows a top view onto an array of memory cells and wordlines of a memory device comprising memory cells according to FIG. 1. The wordlines $WL_n$ are arranged at a distance to one another between the ridges comprising the fins 1. At the longitudinal ends of the fins, with respect to the direction of the wordlines, there are source/drain regions 2, which are formed as doped regions. The wordlines are arranged at the same level with the ridges that comprise the fins, and the memory layer sequence 4, which is not shown in detail in FIG. 2, is arranged between the ridges and the wordlines, forming the storage means between the fins 1 and the gate electrodes 3 that are formed by sections of the wordlines.

Figure 3:
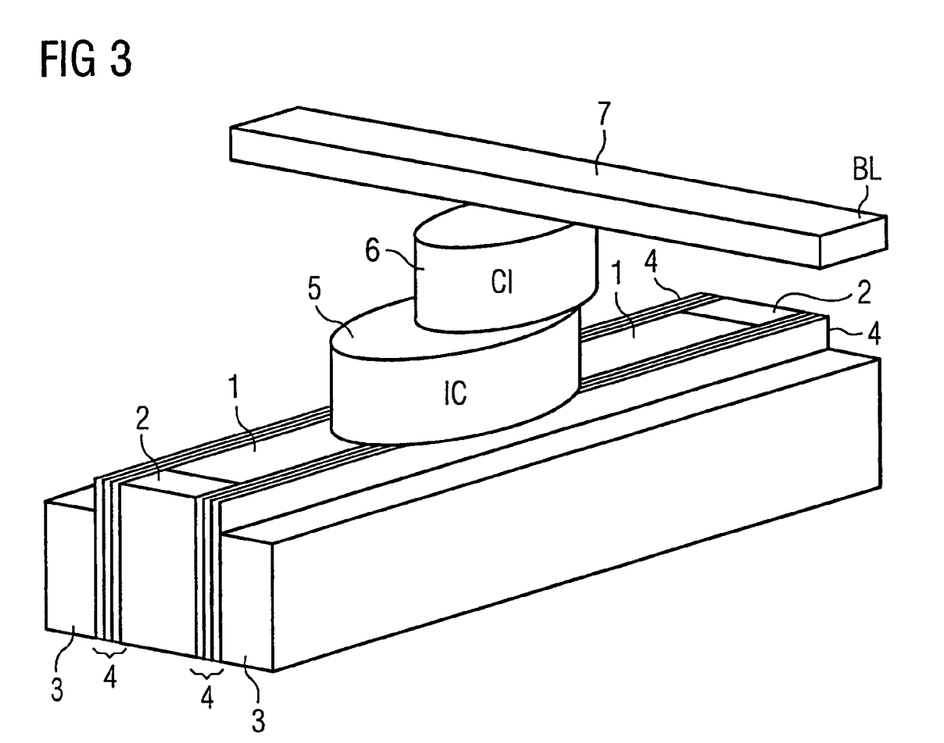
FIG. 3 is a perspective view of an example of the connection of a memory cell to the bitline.

FIG. 3 shows the arrangement of two subsequent memory cells in the same ridge and the electric connection to a bitline that is arranged above. The section shown in FIG. 3 encompasses two fins 1 that are adjacent in the same ridge of semiconductor material. At the longitudinal ends of the fins, there are source/drain regions 2. Every two subsequent source/drain regions 2, which belong to subsequent fins, are together connected to a local interconnect 5, which is arranged as a local contact on the two subsequent source/drain regions 2. The source/drain regions 2 are covered by the local interconnect 5 in FIG. 3 so that only the source/drain regions 2 at the opposite ends of the two represented fins are shown. These source/drain regions 2 are also connected to local interconnects, which in turn also contact a further source/drain region 2 of those fins 1 that follow next in both directions along the ridge.

The bitlines can be arranged immediately above the local interconnects 5. Instead, as shown in FIG. 3, contacts 6 to the interconnects can be provided to facilitate the relative arrangement of the bitlines with respect to the local interconnects 5 and the location of all the source/drain regions 2 that are to be connected by the same bitline. The bitlines BL are formed by conductor tracks 7 electrically connected to the local interconnects 5, eventually via the contacts 6. The bitlines can be doped polysilicon or, preferably, metal conductor tracks, and the wordlines can also be formed of metal, for example tungsten, or of doped polysilicon.

Figure 4:
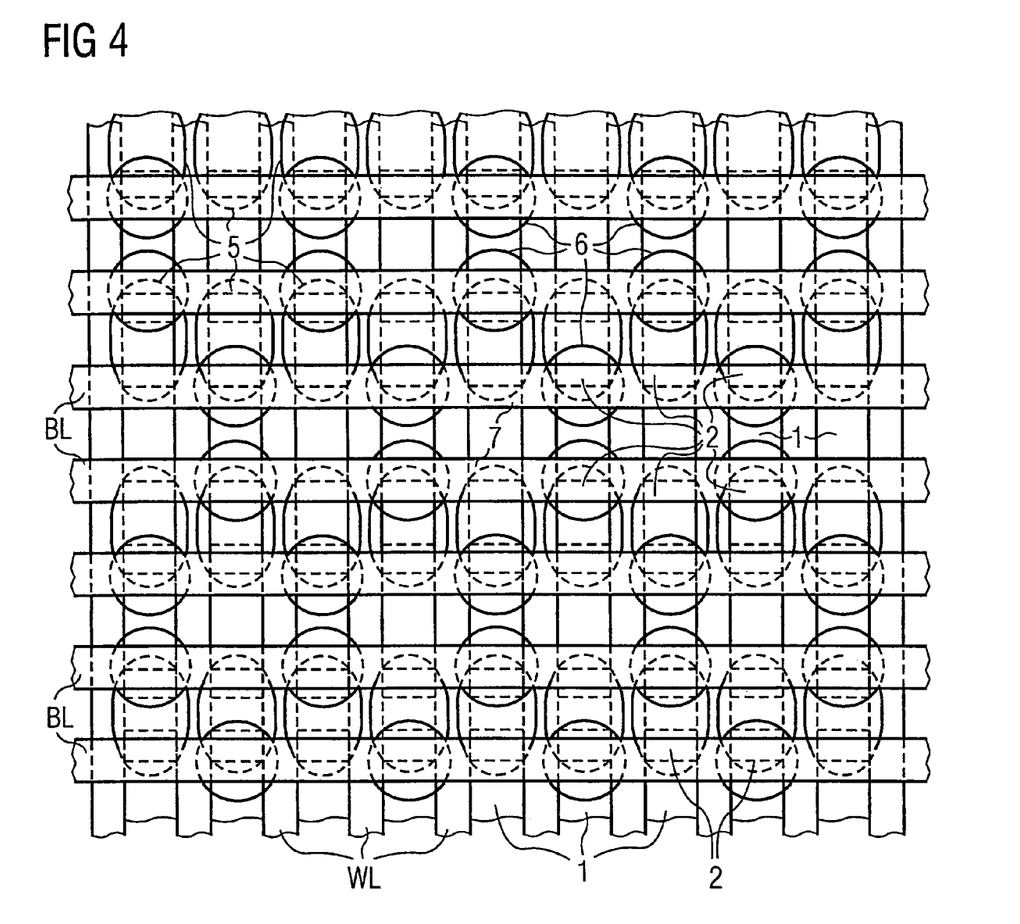
FIG. 4 is a top view of a memory device showing bitlines, local interconnects, and connections to the local interconnects.

FIG. 4 shows a top view onto an array of memory cells, which are contacted with local interconnects and connected by bitlines. The arrangement corresponds to the top view of FIG. 2, with the wordlines WL running from the top to the bottom of the figure and the bitlines BL from left to right. The local interconnects and contacts to the interconnects can be of any geometrical shape that is suitable for the purpose. To improve the readability of FIG. 4, all local interconnects 5 are represented by oval contacts, and all contacts 6 between the local interconnects and the conductor tracks 7 forming the bitlines are represented by circles, indicating a cylindrical shape. The hidden contours of the wordlines WL, the local interconnects 5, and the contacts 6 to the interconnects are represented by broken lines. In this top view of FIG. 4, the bitlines are arranged uppermost, the contacts 6 follow at the next level, the local interconnects 5 are arranged between the semiconductor ridges and the contacts 6, and the ridges comprising the fins 1 and the wordlines are at the lowest level which is shown in FIG. 4. The source/drain regions 2 are shown in FIG. 4 as small rectangular areas, which are also drawn with broken lines.

It is clear from FIG. 4 that the local interconnects 5 are arranged above pairs of source/drain regions 2 that are subsequent along the semiconductor ridges. Each pair of source/drain regions 2 which are connected in this way by the same local interconnect 5 belong to two immediately subsequent memory cells of the same ridge. This means that the fins 1 are mainly situated in the areas between the local interconnects. Each of the wordlines WL is provided to address the memory cells of two neighboring ridges. Therefore, it is important that the source/drain regions 2 of the memory cells that are adjacent to the same wordline on opposite sides of the wordline are connected to different bitlines. By choosing one bitline in FIG. 4 and following this bitline from left to right, it is easily seen that the sequence of local interconnects that are electrically connected to this bitline are arranged on every second ridge. One of the two immediately neighboring bitlines is connected to local interconnects which are arranged on the same ridges as those of the chosen bitline. The other neighboring bitline, on the other side of the chosen bitline, is connected to local interconnects that are situated on the intermediate ridges, in order to address the memory cells of the intermediate ridges. This preferable arrangement can better be characterized in the following way.

Suppose a consecutive enumeration of the ridges in one direction, for example from left to right in FIG. 4, is given. Furthermore, the bitlines can be thought to be grouped into disjoint pairs of neighboring bitlines, these pairs being also consecutively enumerated along one direction parallel to the wordlines. Then memory cells located in even-numbered ridges are connected to even-numbered pairs of bitlines, and memory cells located in odd-numbered ridges are connected to odd-numbered pairs of bitlines. Whether the numbers are even or odd obviously depends on the given enumeration, and the ridges and pairs of bitlines can instead be numbered in such a way that memory cells in even-numbered ridges are connected to odd-numbered pairs of bitlines.

One feature here is that there are pairs of bitlines, which are provided to connect source/drain regions of memory cells in every second ridge. Two neighboring pairs of bitlines are provided to connect memory cells in even-numbered and odd-numbered ridges, respectively, which means that all pairs of bitlines only connect memory cells of every second ridge. The memory cells that are subsequent within the same ridge are addressed by one bitline of the same pair of bitlines and by the nearest bitline of the next but one pair of bitlines. If the bitlines represented in FIG. 4 are, for example, numbered from 1 to 7 from top to bottom of the figure, the source/drain regions of the memory cells that are located in the first ridge on the left side of FIG. 4, for instance, are addressed by bitlines 1 and 2, 2 and 5, and 5 and 6. Bitlines number 3, 4 and 7 do not address any memory cell in the first ridge.

Figure 5A:
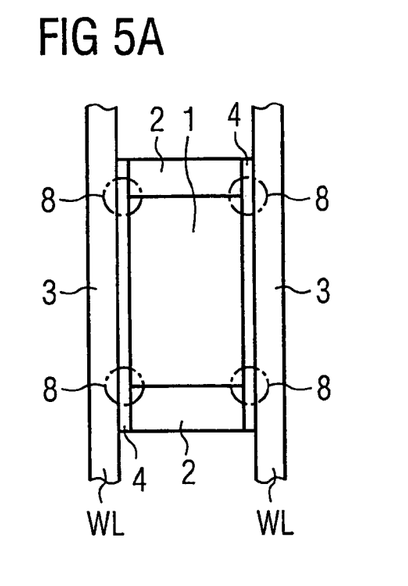
FIG. 5A is a top cross-section of a single memory cell showing the programmable bits.
Figure 5B:
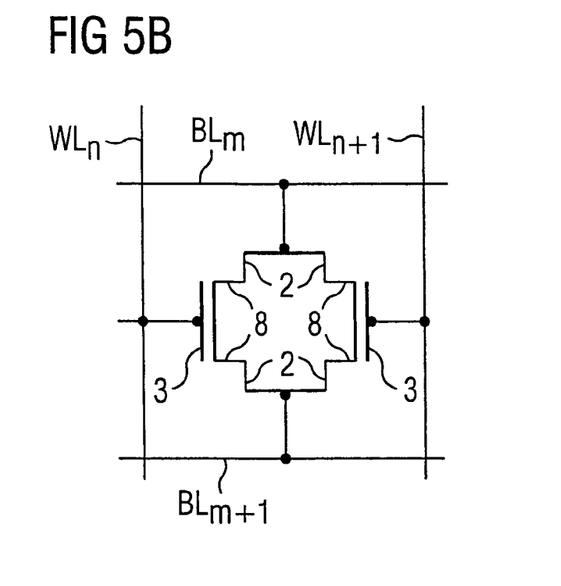
FIG. 5B is a circuit scheme of the memory cell according to FIG. 5A.

FIGS. 5A and 5B show a top cross-section of one memory cell and an appertaining circuit diagram to explain the location of the programmed bits. FIG. 5A shows a fin 1, source/drain regions 2 at both longitudinal ends of the fin 1, and gate electrodes 3 on both sides of the fin, which are electrically insulated from it by memory layer sequences 4. The gate electrodes 3 are part of wordlines WL extending along the semiconductor ridge. As the charge-trapping memory cells enable the programming of bits at both ends of the channel, there are in total four possible bit positions 8, in which a bit of information can be stored.

The circuit diagram in FIG. 5B shows the electric connection of the wordlines to the gate electrodes of the memory cell according to FIG. 5A, and the electric connection of the bitlines to the source/drain regions of the transistor structures. The circuit diagram shows that each memory cell is equivalent to the arrangement of two transistor structures that are arranged opposite to one another and comprise a common transistor body. The channels are located adjacent to the sidewalls of the fin 1, which are covered with the memory layer sequences 4. Therefore, the transistor structure shown in FIG. 5A is equivalent to the structure of two devices, one of which is turned upside down and which are combined rear to rear (i.e., with current paths coupled in parallel).

Figure 6:
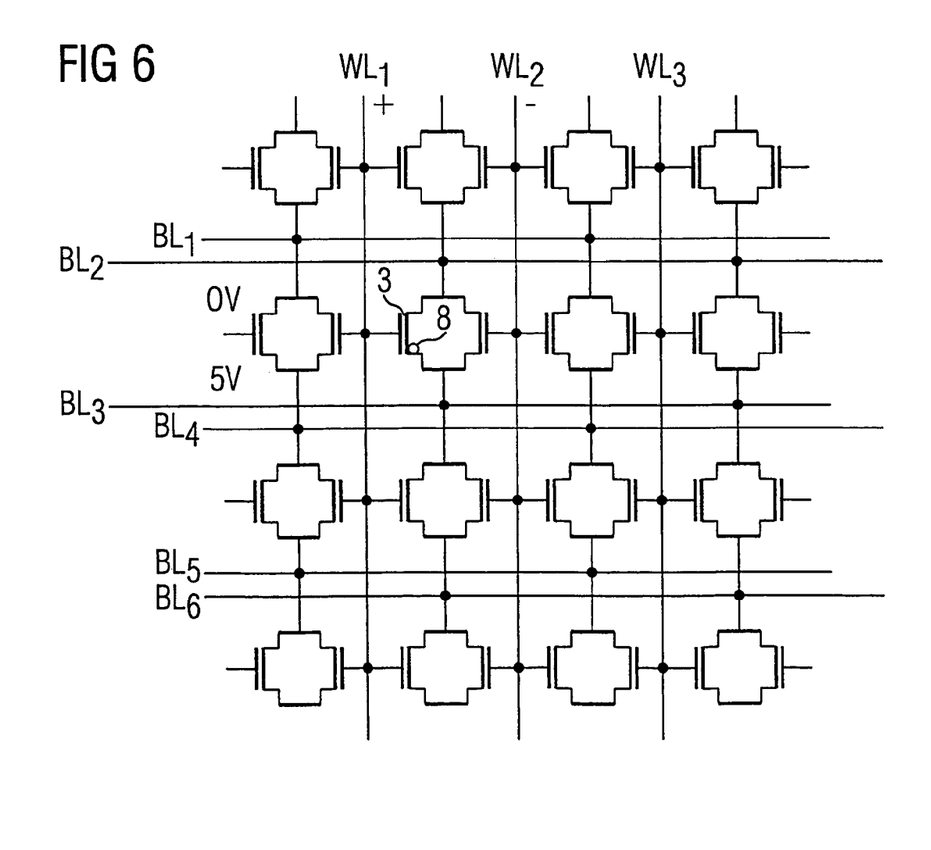
FIG. 6 is a circuit diagram of a memory cell array, showing examples of voltages to be applied during a write operation.

FIG. 6 shows a circuit diagram representing an array of memory cells that are connected to wordlines $WL_1$, $WL_2$, $WL_3$ and bitlines $BL_1$, $BL_2$, $BL_3$, $BL_4$, $BL_5$, $BL_6$. diagram of FIG. 6 explains the operation of the array according to FIG. 4. The location where one bit of information is to be stored is indicated as bit position 8. The gate electrode 3 of the corresponding memory cell transistor is connected to wordline $WL_1$. The source/drain regions of this transistor are connected to bitlines $BL_2$ and $BL_3$. The source/drain regions at the channel end where the bit position 8 is located is connected to a higher voltage than the opposite source/drain region. In the example shown in FIG. 6, a voltage of 5 volts is applied to bitline $BL_3$. Electrons are accelerated in the channel by this voltage to enable channel hot electron injection at the indicated bit position 8.

The channel is opened by a positive electric potential of typically about 5 volts, for example; it is applied to the gate electrode 3 via wordline $WL_1$. A negative electric potential, typically about −2 volts, for example, is applied to the opposite gate electrode of the same memory cell via wordline $WL_2$, in order to switch off the second transistor structure that is present in the same memory cell, i.e., in the same fin. FIG. 6 also shows the arrangement of electric connections of the bitlines, forming disjoint pairs of bitlines, for example $BL_2$ and $BL_3$, or $BL_4$ and $BL_5$. Bitlines $BL_2$ and $BL_3$ are provided to address the memory cells in the second and fourth columns of the section of the array that is shown in FIG. 6, while bitlines $BL_4$ and $BL_5$ are provided to address the memory cells in the first and third columns. The memory cell that is left to the memory cell marked with the bit position 8, for instance, is addressed via bitlines $BL_1$ and $BL_4$.

Figures 7, 8:
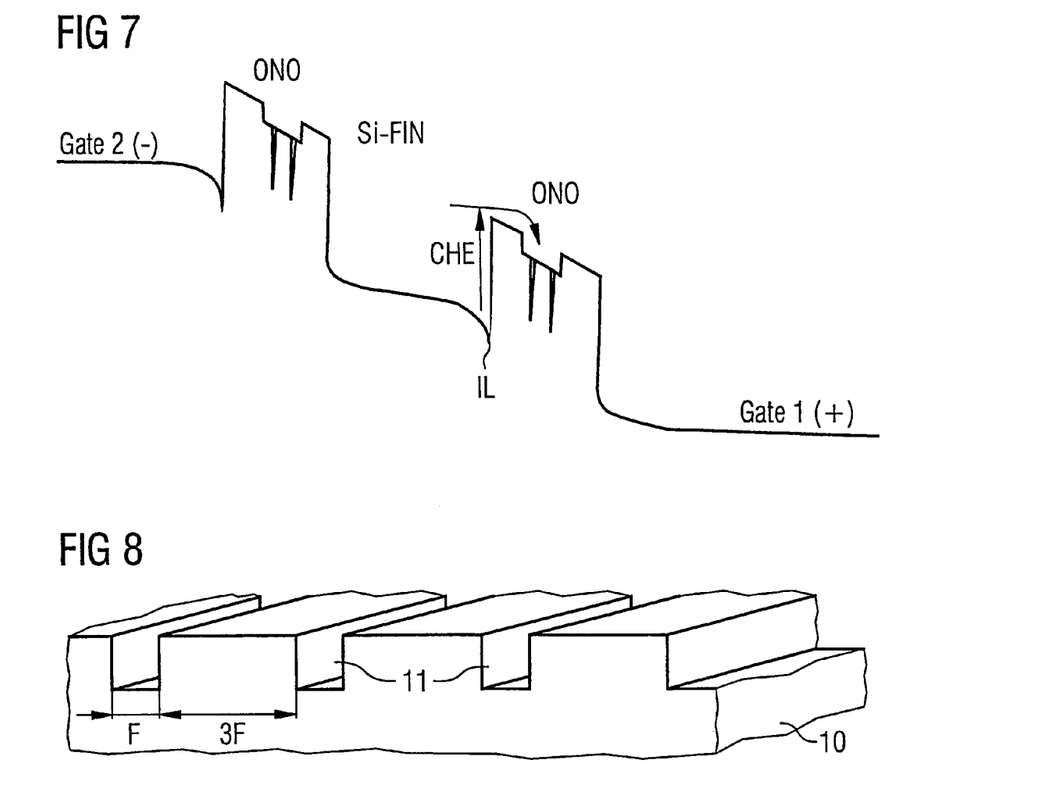
FIG. 7 is an energy band diagram corresponding to the write operation.
FIG. 8 is a perspective cross-section of an intermediate product of a preferred production method.

FIG. 7 shows an energy band diagram for the programming operation. The gate electrode of the transistor that is to be programmed (gate 1, on the right side of the diagram) is on a high (positive) potential (+), and the second gate electrode (gate 2, on the left side of the diagram) is on a low (negative) potential (−). Between the gate electrodes, there are the transistor body (Si-FIN) and the memory layer sequences (ONO)

arranged on opposite sidewalls. In the channel that is controlled by gate 1, channel hot electrons (CHE) are generated by the application of an accelerating voltage between source and drain. These electrons acquire a high kinetic energy which enables them to penetrate the oxide confinement layer, indicated in the diagram by the arrow pointing upwards, and to enter the nitride memory layer, indicated by the curved arrow, to be trapped there. The position of the induced channel formed by an inversion layer is marked IL. This energy diagram is represented for the sake of a better understanding of the write operation, but a thorough explanation of the programming mechanism is not necessary, because charge-trapping memory cells are known per se.

A memory device comprising a memory cell array of memory cells according to this invention will be described by examples of preferred production methods. First, as shown in the perspective cross-section of FIG. 8, a substrate 10 of semiconductor material is provided with a plurality of first trenches 11, which are etched into a main surface of the substrate. The first trenches 11 are arranged at a distance from one another and parallel to one another. They are preferably one unit F of the minimal technology dimension wide and are preferably spaced 3F apart, as indicated in FIG. 8.

Figure 9:
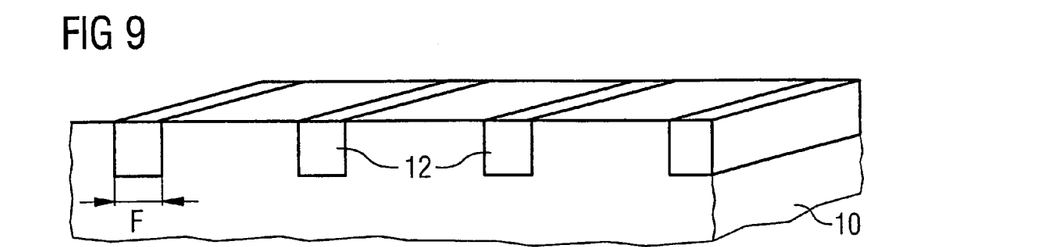
FIG. 9 shows the cross-section according to FIG. 8 after the application of a dopant material.

Next, as shown in FIG. 9, the first trenches 11 are filled with a doped material that is suitable to form doped regions by outdiffusion of doping atoms, for example a dopant glass 12.

Figure 10:
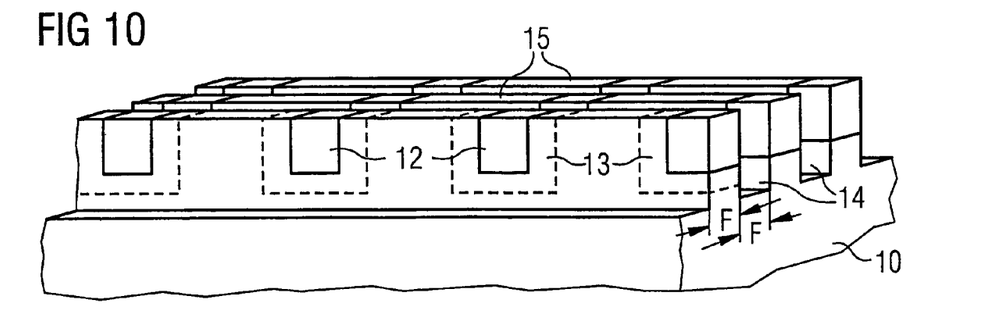
FIG. 10 shows the cross-section according to FIG. 9 after the formation of ridges and source and drain regions.

FIG. 10 shows the perspective cross-section according to FIG. 9 after the formation of second trenches 14 in a direction perpendicular to the direction of the first trenches 11, thereby forming ridges 15. As indicated in FIG. 10, the second trenches 14 and the ridges 15 are preferably one unit of the minimal dimension F wide. A dielectric layer sequence provided for the memory layer sequence is applied all over the surface of the ridges and second trenches. The dielectric layer sequence is not shown in FIG. 10 in order not to cover the other details.

Diffusion regions 13 are subsequently formed by a diffusion of doping atoms out of the remaining parts of the dopant glass 12. This is promoted by an elevation of the temperature (furnace diffusion). The diffusion regions 13 are indicated with broken lines in FIG. 10.

Figure 11:
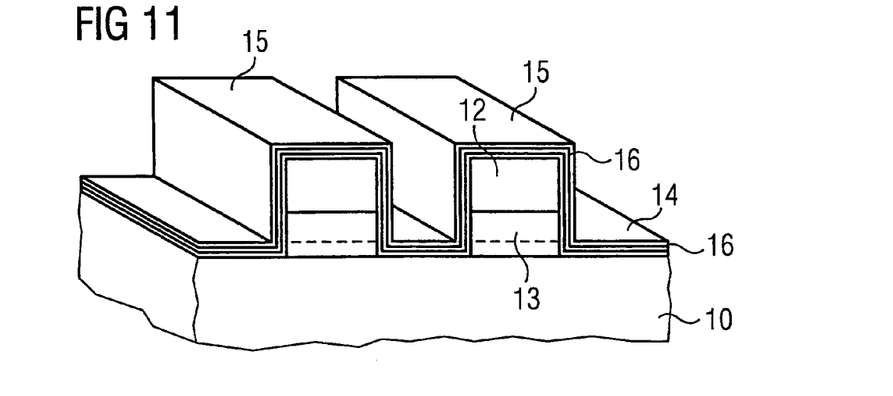
FIG. 11 is the cross-section according to FIG. 10, taken in the direction from right to left and showing the arrangement of a dielectric layer sequence.

FIG. 11 shows a perspective cross-section, which is seen from a direction that is at an angle to the line of view of FIG. 10. In FIG. 11, the dielectric layer sequence 16 is also shown. The ridges 15 comprise the fins that are provided for the memory cells and still contain the remaining parts of the dopant glass 12, surrounded by the produced diffusion regions 13. It is preferable to apply the dielectric layer 16, before the temperature step to promote the diffusion is performed.

Figure 12:
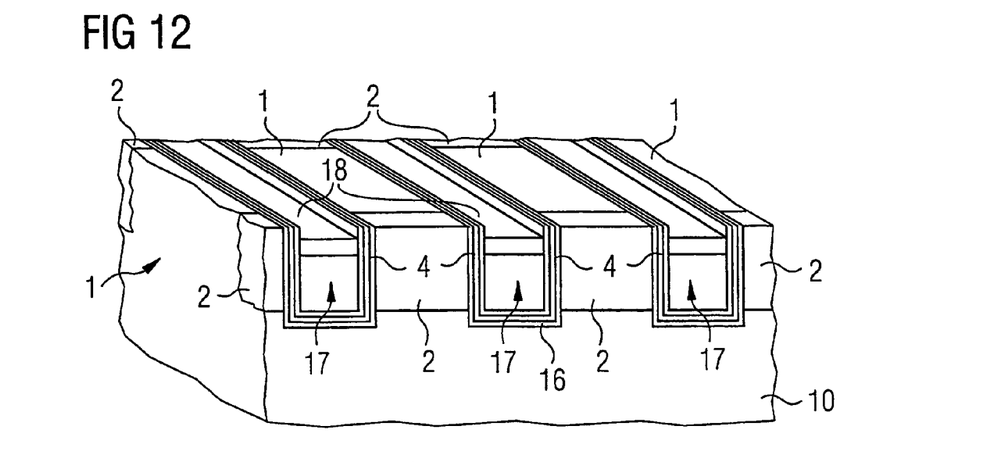
FIG. 12 shows the view according to FIG. 11 after the formation of wordlines.

FIG. 12 shows the cross-section according to FIG. 11, after the second trenches 14 have been filled with an electrically conducting material 17, which is provided for the wordlines. This material can be doped polysilicon, for example, or a metal like tungsten. After the deposition of this material, the surface can be planarized, for example by CMP (chemical mechanical polishing). This planarization stops on the top of the ridges, where the dielectric layer sequence 16 is preferably completely removed. The electrically conducting material 17 is recessed, and the recesses are filled with an electrically insulating cover 18, for instance nitride, which is preferably also slightly recessed.

Figure 13:
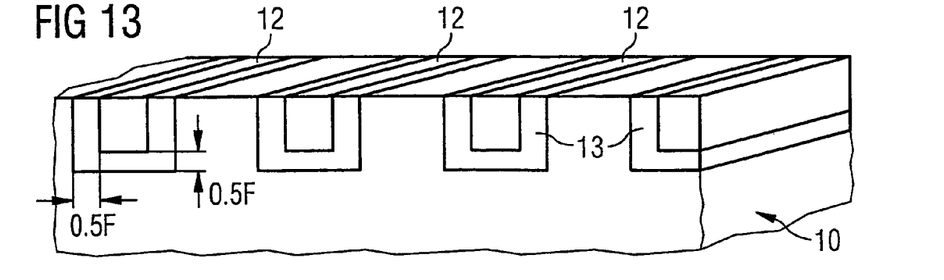
FIG. 13 shows a perspective cross-section of an intermediate product corresponding to FIG. 9 after the formation of diffusion regions.
Figure 14:
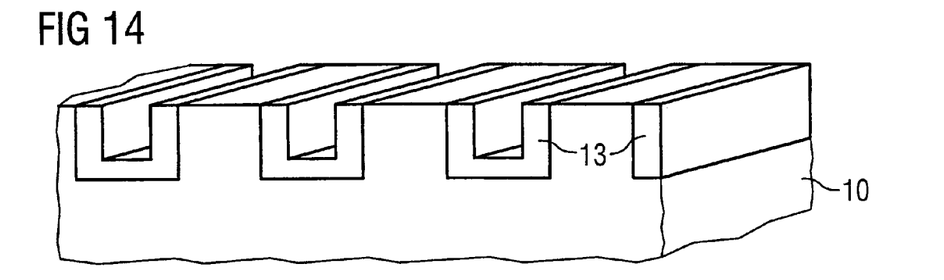
FIG. 14 shows the cross-section according to FIG. 13 after the removal of the doping material.
Figure 15:
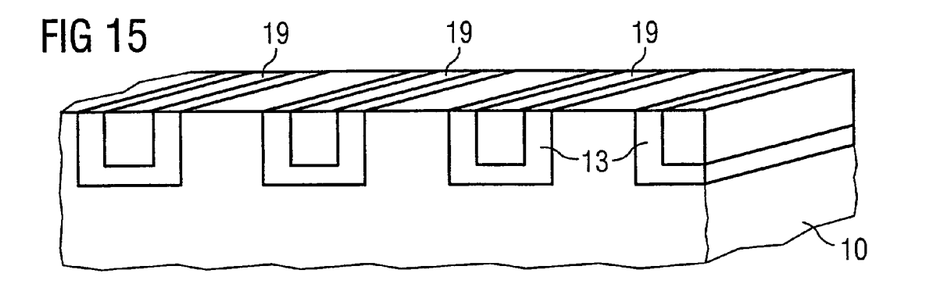
FIG. 15 shows the cross-section according to FIG. 14 after the application of an electrically insulating filling.

In an alternative method, starting from the intermediate product of FIG. 9, a diffusion of doping atoms to form the diffusion regions 13, according to FIG. 13, takes place first. The doping material, which can be a dopant glass 12, is then removed, as shown in FIG. 14. The opened first trenches are then again filled, as shown in FIG. 15, this time by a deposition of an electrically insulating filling 19, which may be an oxide or nitride.

Figure 16:
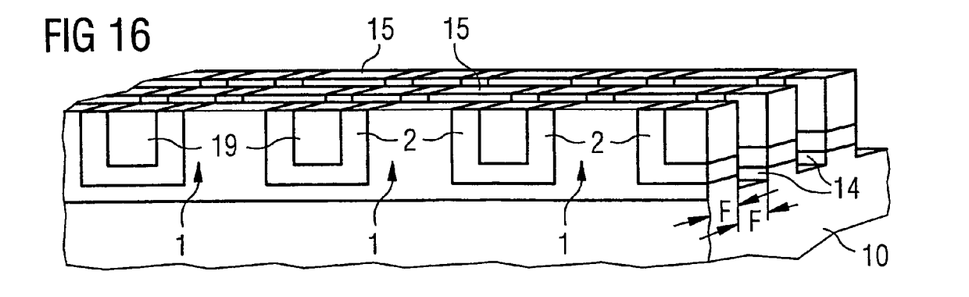
FIG. 16 shows the cross-section according to FIG. 15 after the formation the ridges.

Then, as shown in FIG. 16, the second trenches 14 are etched to form the ridges 15, rendering a structure comparable to that of FIG. 10. The position of the fins 1 within the ridges 15 and the source/drain regions 2 are indicated in FIG. 16. The application of a dielectric layer sequence follows to obtain an intermediate product corresponding to the product shown in FIG. 11. The electrically conducting material 17 and the insulating cover 18 can be applied as well to obtain an intermediate product according to FIG. 12.

Figure 17:
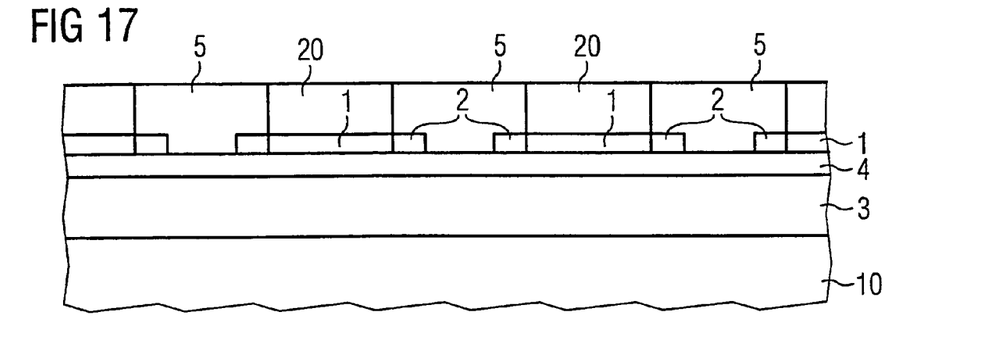
FIG. 17 shows a cross-section of an intermediate product along a ridge after the formation of local interconnects.

FIG. 17 is a cross-section of a further intermediate product, taken along a wordline. This intermediate product is obtained proceeding from the intermediate product according to FIG. 12 by the application of local interconnects 5, which can be formed of metal like tungsten. The interspaces are filled with a dielectric layer 20. This can be done by a standard technology, for example by applying a dielectric layer and forming contact holes in the dielectric layer, which are then filled with electrically conductive material, for instance tungsten, the fillings forming the local interconnects 5.

The local interconnects 5 are applied in electric contact to pairs of source/drain regions 2. The wordlines comprising the gate electrodes 3 can be arranged slightly recessed to a distance from the edge of the ridges so that the fins 1 and/or memory layer sequences 4 more or less exceed the top of the wordlines.

Figure 18:
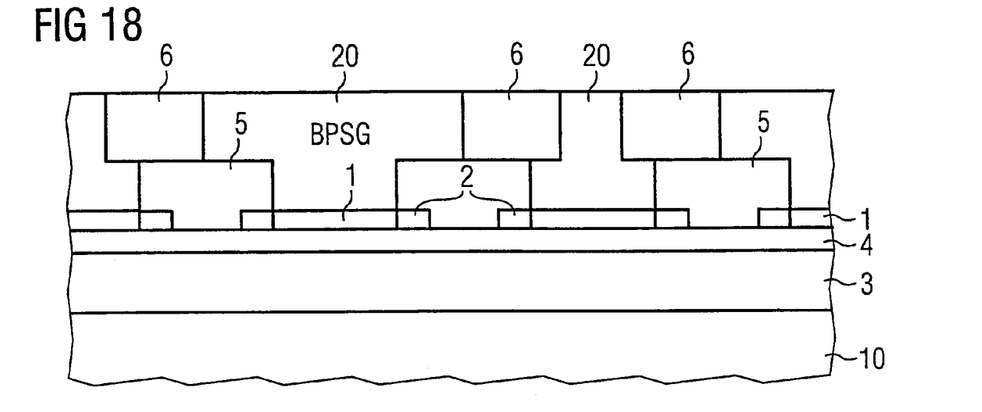
FIG. 18 shows the cross-section according to FIG. 17 after the formation of connections to the local interconnects.

FIG. 18 shows the further intermediate product after the production of contacts 6 to the local interconnects 5, in order to facilitate the electric connection to the bitlines.

Figure 19:
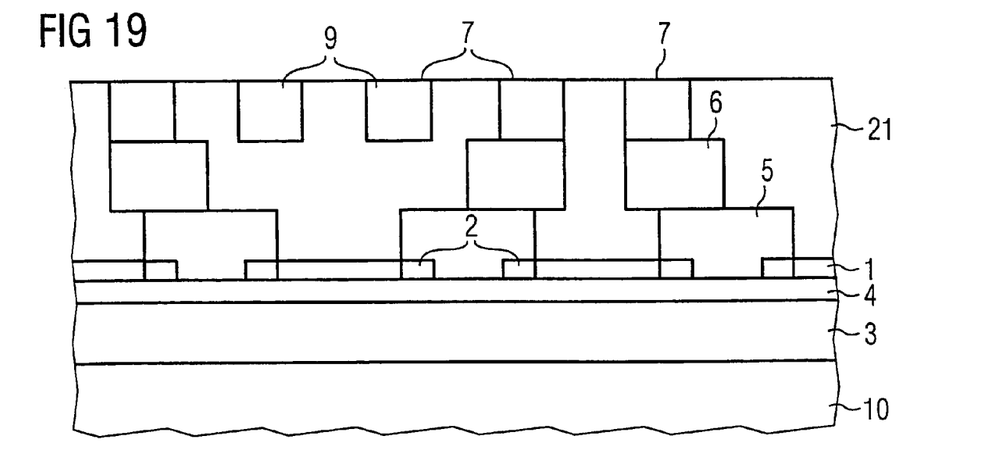
FIG. 19 shows the cross-section according to FIG. 18 after the formation of bitlines.

FIG. 19 shows the cross-section according to FIGS. 17 and 18 with an arrangement of bitlines formed as conductor tracks 7 in a further dielectric layer 21. The passing bitlines 9 are connected to contacts 6 that belong to the neighboring ridges before and behind the plane of drawing. The arrangement of local interconnects 5, contacts 6, and conductor tracks 7 can be produced by a standard damascene process, which is known per se. The dielectric layers 20 and 21 may be any intermetal dielectric, for example an oxide or BPSG (borophosphorus silicate glass).

Although the present invention and its advantages have been described in detail, it should be understood that various changes, substitutions and alterations can be made herein without departing from the spirit and scope of the invention as defined by the appended claims.

What is claimed is:

1. A row of charge-trapping memory cells, each of said charge-trapping memory cells in said row comprising:
   a ridge of semiconductor material having a first sidewall and an opposed second sidewall, the ridge being configured as a fin structure;
   a source region disposed within the ridge of semiconductor material;
   a drain region disposed within the ridge of semiconductor material and being laterally spaced from the source region such that the source region and the drain region are arranged within the fin structure at a distance from one another along a longitudinal axis that extends parallel to an upper surface of the ridge of semiconductor material;
   a first memory layer sequence of dielectric material arranged on the first sidewall, the first memory layer sequence including a memory layer provided for charge-trapping between confinement layers; and
   a second memory layer sequence of dielectric material arranged on the second sidewall, the second memory layer sequence including a memory layer provided for charge-trapping between confinement layers;

said row of charge-trapping memory cells comprising:

a first conductive layer, comprising both a gate electrode and a wordline, having a surface arranged over the first memory layer sequence, said surface of said first conductive layer parallel to and extending continuously along the row of charge-trapping memory cells; and a second conductive layer, comprising both a gate electrode and a wordline, having a surface arranged over the second memory layer sequence, said surface of said second conductive layer parallel to and extending continuously along the row of charge-trapping memory cells.

2. The row of charge-trapping memory cells as claimed in claim 1, wherein the ridge comprises an integral part of a semiconductor substrate.

3. The row of charge-trapping memory cells as claimed in claim 2, wherein the ridge is laterally delimited by two parallel trenches that are formed in the semiconductor substrate, and wherein the first and second conductive layers are arranged within the trenches.

4. The row of charge-trapping memory cells as claimed in claim 1, further comprising local interconnects of electrically conducting material being arranged above and electrically coupled to one of the source region and the drain region.

5. The row of charge-trapping memory cells as claimed in claim 1, further comprising:

a first local interconnect of electrically conducting material being arranged above and electrically coupled to the source region; and a second local interconnect of electrically conducting material being arranged above and electrically coupled to the drain region.

6. The row of charge-trapping memory cells as claimed in claim 1, wherein, in both the first memory layer sequence and the second memory layer sequence, the memory layer comprises a nitride layer and the confinement layers comprise oxide layers.

7. The row of charge-trapping memory cells of claim 1, further comprising:

local interconnects provided to electrically contact the source region and the drain region; and conductor tracks provided as bitlines to electrically connect pluralities of the local interconnects that are arranged along rows across the wordlines.

8. The row of charge-trapping memory cells as claimed in claim 7, wherein each of the first and second conductive layers are provided for two channel regions located on opposite sides in neighboring ridges.

9. The row of charge-trapping memory cells as claimed in claim 7, wherein the ridge comprises sections, each section comprising one of the channel regions, and wherein the sections form memory cells that are provided for the storage of four bits.

10. The row of charge-trapping memory cells as claimed in claim 9, wherein the local interconnects are provided for the electric connection of two adjacent ones of the source and drainregions belonging to two adjacent ones of the memory cells.

11. The row of charge-trapping memory cells as claimed in claim 7, wherein the bitlines are each electrically connected to a plurality of the local interconnects that are provided for an electric connection of the source and drain regions of every second of the memory cells along one of the rows.

12. The row of charge-trapping memory cells as claimed in claim 11, wherein the bitlines are arranged in one metallization layer and are grouped into disjointed pairs of neighboring bitlines, and wherein, given a consecutive enumeration of the pairs of bitlines in a direction along the ridge and a consecutive enumeration of the ridge in one direction, memory cells located in even-numbered ridges are coupled to even-numbered pairs of bitlines, and memory cells located in odd-numbered ridges are coupled to odd-numbered pairs of bitlines, or vice versa.

13. The row of charge-trapping memory cells as claimed in claim 12, wherein:

both bitlines belonging to an even-numbered pair and one of the bitlines of the previous or next even-numbered pair are coupled to two subsequent ones of the memory cells along the ridge; and both bitlines belonging to an odd-numbered pair and one of the bitlines of the previous, or the next odd-numbered pair are coupled to two subsequent ones of the memory cells along the ridge.

14. A memory device comprising:

a semiconductor substrate;

a plurality of parallel trenches formed in the semiconductor substrate defining a plurality of ridges in the semiconductor substrate, each ridge between two of the trenches and having first and second planar sidewalls and each trench between two of the ridges;

each trench including a first memory layer sequence along the first planar sidewall of one of the two ridges and a second memory layer sequence along the second planar sidewall of the other of the two ridges, in each case the first and second memory layer sequences overlying a channel region of semiconductor material within the ridge;

a plurality of source and drain regions, each source and drain region formed within a ridge such that each source region is laterally spaced from a drain region by the channel region, the channel region extending in a direction substantially parallel to an upper surface of the semiconductor substrate; and a plurality of conductors extending alongside each of said plurality of source and drain regions in a ridge, each conductor filling one of the trenches and disposed:

adjacent the first memory layer sequence and the second memory layer sequence; and adjacent each of the channel region, the source region and the drain region, wherein each conductor comprises an integrated gate electrode and a wordline.

15. The device of claim 14, wherein each first and second memory layer sequence comprises:

a first confinement layer;

a memory layer adjacent the first confinement layer, the memory layer comprising a dielectric material for trapping charges; and a second confinement layer adjacent the memory layer.

16. The device of claim 14, and further comprising a plurality of local interconnects, each local interconnect coupled to one of the source and drain regions.

17. The device of claim 16, and further comprising a plurality of conductive lines overlying the semiconductor substrate, each conductive line being coupled to at least one of the local interconnects.

18. The row of charge-trapping memory cells as claimed in claim 1, wherein:

the first conductive layer is arranged on the first memory layer sequence adjacent to a first channel region of the ridge, the first channel region disposed between the source region and the drain region; and the second conductive layer is arranged on the second memory layer sequence adjacent to a second channel region of the ridge, the second channel region disposed between the source region and the drain region.

19. The row of charge-trapping memory cells as claimed in claim 1, wherein the surface of the first conductive layer is planar and the surface of the second conductive layer is planar.

20. A row of charge-trapping memory cells, each of said charge-trapping memory cells in said row comprising:
a ridge of semiconductor material having a first sidewall and an opposed parallel second sidewall, the ridge being configured as a fin structure;
a source region disposed within the ridge of semiconductor material;
a drain region disposed within the ridge of semiconductor material at a distance from the source region;
a first memory layer sequence of dielectric material arranged on the first sidewall;
a second memory layer sequence of dielectric material arranged on the second sidewall;
a first conductive layer physically connecting each of the charge-trapping memory cells in the row of charge-trapping memory cells, wherein the first conductive layer is arranged on the first memory layer sequence, said first conductive layer comprising an integrated gate electrode and a wordline having a planar surface extending along and parallel to the first memory layer sequence in said row; and
a second conductive layer physically connecting each of the charge-trapping memory cells in the row of charge-trapping memory cells, wherein the second conductive layer is arranged on the second memory layer sequence, said second conductive layer comprising an integrated gate electrode and a wordline having a planar surface extending along and parallel to the second memory layer sequence in said row, the second conductive layer being electrically isolated from the first conductive layer.

21. The row of charge-trapping memory cells as claimed in claim 20, wherein the drain region is laterally spaced from the source region such that the source region and the drain region are arranged within the fin structure at a distance from one another along a longitudinai axis that extends parallel to an upper surface of the ridge of semiconductor material.

22. The row of charge-trapping memory cells as claimed in claim 20, wherein the ridge comprises an integral part of a semiconductor substrate.

23. The row of charge-trapping memory cells as claimed in claim 22, wherein the ridge is laterally delimited by two parallel trenches that are formed in the semiconductor substrate and wherein the gate electrodes are arranged within the trenches.

24. The row of charge-trapping memory cells as claimed in claim 20, further comprising a local interconnect of electrically conducting material being arranged above and electrically coupled to one of the source region and the drain region.

25. The row of charge-trapping memory cells as claimed in claim 20, further comprising:
a first local interconnect of electrically conducting material being arranged above and electrically coupled to the source region; and
a second local interconnect of electrically conducting material being arranged above and electrically coupled to the drain region.

26. The row of charge-trapping memory cells as claimed in claim 20, wherein both the first memory layer sequence and the second memory layer sequence comprise a memory layer comprising a nitride layer, and wherein confinement layers comprise oxide layers.

27. The row of charge-trapping memory cells as claimed in claim 20, wherein:
the first memory layer sequence of dielectric material comprises a memory layer provided for charge-trapping between confinement layers; and
the second memory layer sequence of dielectric material comprises a memory layer provided for charge-trapping between the confinement layers.

28. An array of dual gate memory devices comprising:
a first conductor line comprising an integrated first gate electrode and first wordline, the first conductor line connecting individual devices in a first row of gate electrodes of the dual gate memory devices;
a second conductor line comprising an intearated second gate electrode and second wordline, the second conductor line connecting individual devices in second and third rows of gate electrodes of the dual gate memory devices, wherein the first and second rows of gate electrodes sandwich common fins and comprise a first set of dual gate memory devices;
a third conductor line comprising an integrated third gate electrode and third wordline, the third conductor line connecting individual devices in a fourth row of gate electrodes of dual gate memory devices, wherein the third and fourth rows of gate electrodes sandwich common fins and comprise a second set of dual gate memory devices;
a first bitline connecting a source of a dual gate memory device from the first set of dual gate memory devices, but not a source of a dual gate memory device from the second set of dual gate memory devices; and
a second bitline connecting a drain of a dual gate memory device from the first set of dual gate memory devices, but not a drain of a dual gate memory device from the second set of dual gate memory devices.

29. An array of dual gate memory devices comprising:
a first conductor line comprising an integrated first gate electrode and first wordline, the first conductor line connecting individual devices in a first row of gate electrodes of the dual gate memory devices;
a second conductor line comprising an integrated second gate electrode and second wordline, the second conductor line connecting individual devices in second and third rows of gate electrodes of the dual gate memory devices, wherein the first and second rows of gate electrodes sandwich common fins and comprise a first set of dual gate memory devices;
a third conductor line comprising an integrated third gate electrode and third wordline, the third conductor line connecting individual devices in a fourth row of gate electrodes of dual gate memory devices, wherein the third and fourth rows of gate electrodes sandwich common fins and comprise a second set of dual gate memory devices; and
bit lines connecting alternate sets of dual gate memory devices, but not adjacent sets of dual gate memory devices.

* * * * *

UNITED STATES PATENT AND TRADEMARK OFFICE
CERTIFICATE OF CORRECTION

PATENT NO. : 7,423,310 B2
APPLICATION NO. : 10/952707
DATED : September 9, 2008
INVENTOR(S) : Verhoeven It is certified that error appears in the above-identified patent and that said Letters Patent is hereby corrected as shown below:

In Col. 6, line 32, before diagram insert --The--.
In Col. 9, line 61, delete "drainregions" and insert --drain regions--.
In Col. 11, line 42, delete "lateraily" and insert --laterally--.
In Col. 11, line 45, delete "longitudinai" and insert --longitudinal--.
In Col. 12, line 19, delete "intearated" and insert --integrated--.

Signed and Sealed this

Eleventh Day of November, 2008

JON W. DUDAS
*Director of the United States Patent and Trademark Office*